(12) United States Patent
Lee et al.

(10) Patent No.: US 11,373,699 B2
(45) Date of Patent: Jun. 28, 2022

(54) ADDRESS AND COMMAND GENERATION CIRCUIT, AND SEMICONDUCTOR SYSTEM

(71) Applicant: SK hynix Inc., Icheon-si (KR)

(72) Inventors: Dong Uk Lee, Seoul (KR); Ji Hwan Kim, Seoul (KR); Heat Bit Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 4 days.

(21) Appl. No.: 17/000,052

(22) Filed: Aug. 21, 2020

(65) Prior Publication Data

US 2020/0388322 A1    Dec. 10, 2020

Related U.S. Application Data

(62) Division of application No. 16/122,075, filed on Sep. 5, 2018, now Pat. No. 10,790,011.

(30) Foreign Application Priority Data

Feb. 26, 2018    (KR) ........................ 10-2018-0023011

(51) Int. Cl.

| | |
|---|---|
| *G11C 29/00* | (2006.01) |
| *G11C 11/4096* | (2006.01) |
| *G11C 29/42* | (2006.01) |
| *G11C 7/10* | (2006.01) |
| *G11C 8/18* | (2006.01) |
| *G11C 8/00* | (2006.01) |
| *G06F 3/06* | (2006.01) |

(52) U.S. Cl.
CPC ........ *G11C 11/4096* (2013.01); *G11C 7/1063* (2013.01); *G11C 8/00* (2013.01); *G11C 8/18* (2013.01); *G11C 29/42* (2013.01); *G06F 3/064* (2013.01); *G06F 3/0679* (2013.01)

(58) Field of Classification Search
CPC ............. G06F 11/1008; G06F 11/1068; G06F 11/1048; G06F 11/10; G06F 3/0604; G11C 11/406; G11C 29/44; G11C 29/42; G11C 11/1673
See application file for complete search history.

(56) References Cited

U.S. PATENT DOCUMENTS

| | | | | |
|---|---|---|---|---|
| 6,327,680 | B1 * | 12/2001 | Gervais .................. | G11C 29/44 714/710 |
| 6,462,993 | B2 * | 10/2002 | Shinozaki .............. | G11C 29/84 365/200 |

(Continued)

FOREIGN PATENT DOCUMENTS

| | | |
|---|---|---|
| KR | 1020160034913 A | 3/2016 |
| KR | 101687038 B1 | 12/2016 |

(Continued)

*Primary Examiner* — Esaw T Abraham
(74) *Attorney, Agent, or Firm* — William Park & Associates Ltd.

(57) ABSTRACT

An address and command generation circuit, and a semiconductor system are disclosed. The address and command generation circuit may include a column address generator configured to correct an error of a column address, generate an internal column address based on an uncorrected column address when the column address corresponds to a read command, and generate the internal column address based on the corrected column address when the column address corresponds to a write command.

7 Claims, 6 Drawing Sheets

(56) References Cited

U.S. PATENT DOCUMENTS

| | | | |
|---|---|---|---|
| 6,462,994 B2 * | 10/2002 | Kim | G11C 29/804 365/200 |
| 6,965,537 B1 | 11/2005 | Klein et al. | |
| 7,120,846 B2 * | 10/2006 | Kawagishi | H04L 1/1809 714/748 |
| 7,464,241 B2 | 12/2008 | Vogt | |
| 7,535,780 B2 * | 5/2009 | Lee | G11C 29/80 365/200 |
| 7,729,191 B2 | 6/2010 | Smith et al. | |
| 7,796,451 B2 * | 9/2010 | Norman | G11C 29/808 365/200 |
| 7,965,530 B2 | 6/2011 | Han et al. | |
| 8,219,860 B2 * | 7/2012 | Fey | G06F 11/1048 714/712 |
| 8,880,970 B2 | 11/2014 | Gillingham | |
| 8,929,165 B2 * | 1/2015 | Son | G11C 29/808 365/200 |
| 8,990,667 B2 | 3/2015 | Kuriyama | |
| 9,153,590 B2 | 10/2015 | Lim et al. | |
| 9,235,466 B2 | 1/2016 | Sohn et al. | |
| 9,727,412 B2 * | 8/2017 | Son | G06F 11/1666 |
| 10,049,006 B2 | 8/2018 | Reed et al. | |
| 10,235,258 B2 | 3/2019 | Son et al. | |
| 2010/0162053 A1 | 6/2010 | Gillingham | |
| 2015/0019936 A1 | 1/2015 | Gillingham | |
| 2016/0077911 A1 | 3/2016 | Malshe et al. | |
| 2016/0170831 A1 | 6/2016 | Lesartre et al. | |

FOREIGN PATENT DOCUMENTS

| | | |
|---|---|---|
| KR | 20160144564 A | 12/2016 |
| WO | 2015012838 A1 | 1/2015 |

* cited by examiner

ADDRESS AND COMMAND GENERATION CIRCUIT, AND SEMICONDUCTOR SYSTEM

CROSS-REFERENCE TO RELATED APPLICATION

This application is a divisional application of U.S. patent application Ser. No. 16/122,075, filed on Sep. 5, 2018, issued as the U.S. Pat. No. 10,790,011 on Sep. 29, 2020, and claims priority based upon Korean patent application No. 10-2018-0023011, filed on Feb. 26, 2018, the disclosure of which is hereby incorporated in its entirety by reference herein.

BACKGROUND

1. Technical Field

Embodiments of the present disclosure may generally relate to an address and command generation circuit, a semiconductor system, and more particularly to a technology for generating an internal address and an internal command upon receiving an address and a command.

2. Related Art

A semiconductor device receives an address and command and data from a semiconductor control device (for example, a memory controller), and performs operations corresponding to the received address and command and the received data. During transmission of the address and command and data, an unexpected error may occur.

In relation to the use of data, an improved semiconductor device has recently been designed to use the following data transmission and reception method. In more detail, the semiconductor device may receive not only data but also error correction data for correcting one or more errors of the data from a semiconductor control device, and may store the data and the error correction data. Thereafter, when transmitting data to the semiconductor control device (for example, during a read operation), the semiconductor device may correct one or more errors of the data using the error correction data.

SUMMARY

In accordance with an embodiment of the present disclosure, an address and command generation circuit may include a column address generator configured to correct an error of a column address, generate an internal column address based on an uncorrected column address when the column address corresponds to a read command, and generate the internal column address based on the corrected column address when the column address corresponds to a write command.

In accordance with an embodiment of the present disclosure, an address and command generation circuit may include an row address generator configured to generate at least some parts of a row address as an internal row address, correct an error of the row address, and generate a row fail flag signal based on the row address and the corrected row address. The address and command generation circuit may include a row command generator configured to generate an active signal or a precharge signal based on the row address. The address and command generation circuit may include an column address generator configured to correct an error of a column address, and selectively output either at least some parts of the column address or the corrected column address as an internal column address based on a write flag signal. The address and command generation circuit may include a column command generator configured to generate a read command, the write flag signal, or a write command based on the column address and the row fail flag signal.

In accordance with an embodiment of the present disclosure, a semiconductor system may include a semiconductor control device configured to transmit a row address or a column address. The semiconductor system may include a semiconductor device configured to, when a failed part of the row address or the column address is detected and the column address corresponds to a read command, perform a read operation for the row address and the column address, and activate an address error signal indicating the failed part of the row address or the column address.

In accordance with an embodiment of the present disclosure, a semiconductor system may include a semiconductor control device configured to transmit an address. The semiconductor system may include a semiconductor device configured to, when a failed part of the address is detected and the address corresponds to a write command, deactivate the write command, and activate an address error signal.

In accordance with an embodiment of the present disclosure, a method of operating an address and command generation circuit may include generating, with a selection circuit, an internal column address based on an uncorrected column address when a column address corresponds to a read command, and generating the internal column address based on a corrected column address when the column address corresponds to a write command.

DETAILED DESCRIPTION

Reference will now be made to embodiments of the present disclosure, examples of which are illustrated in the accompanying drawings. Wherever possible, the same reference numbers are used throughout the drawings to refer to the same or like portions.

Various embodiments of the present disclosure may be directed to providing an address generation circuit, an address and command generation circuit, and a semiconductor system that substantially obviates one or more problems due to limitations and disadvantages of the related art.

An embodiment of the present disclosure may relate to a technology for correcting at least one error of an address and or a command. However, assuming that at least one error of the address and command is simultaneously corrected, a time delay for correcting the error may unavoidably occur, resulting in reduction of an operation speed. In order to address the above-mentioned issues, a technology for preventing reduction of the operation speed caused by the time delay is needed.

It is to be understood that both the foregoing general description and the following detailed description of the present disclosure are exemplary and explanatory and are intended to provide further explanation of the disclosure as claimed.

Figure 1:
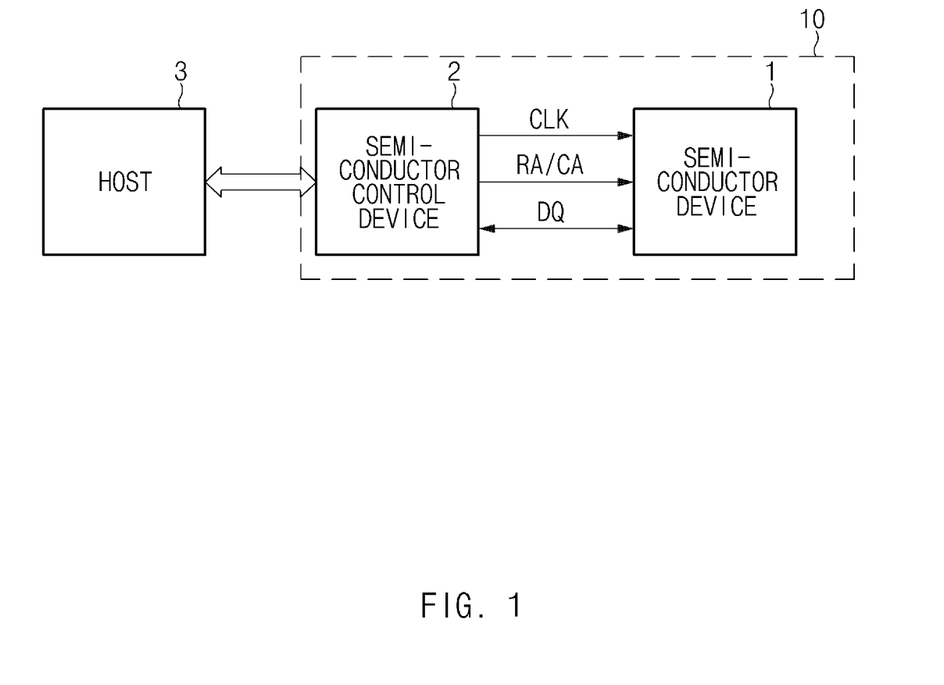
FIG. 1 is a block diagram illustrating a representation of an example of an information processing system according to an embodiment of the present disclosure.

FIG. 1 is a block diagram illustrating a representation of an example of an information processing system according to an embodiment of the present disclosure.

Referring to FIG. 1, the information processing system may include a host 3 and a semiconductor system 10. The semiconductor system 10 may include a semiconductor control device 2 and a semiconductor device 1.

The semiconductor device 1 may be a memory device such as a DRAM or flash memory. The semiconductor control device 2 may be a memory controller configured to control the memory device. The semiconductor device 1 and the semiconductor memory device 2 may also be implemented as a single module denoted by dotted lines. For example, the host 3 may be a Central Processing Unit (CPU), a Graphics Processing Unit (GPU), an Application Processor (AP), or the like.

The host 3 may transmit a request (REQ) and data (DATA) to the semiconductor control device 2 to access the semiconductor device 1. The host 3 may transmit data to the semiconductor control device 2 to store data in the semiconductor device 1. The host 3 may receive data from the semiconductor device 1 through the semiconductor control device 2. The semiconductor memory device 2 may relay communication between the host 3 and the semiconductor device 1. The semiconductor control device 2 may receive the request (REQ) and data (DATA) from the host 3, may generate data (DQ), a row address (RA), a column address (CA), a clock signal (CLK), etc. to control the semiconductor device 1, and may transmit the generated result to the semiconductor device 1. In an embodiment, each of the row address (RA) and the column address (CA) may include a command. The semiconductor control device 2 may output data (DQ) generated from the semiconductor device 1 to the host 3.

Although FIG. 1 illustrates that the host 3 and the semiconductor control device 2 are physically separated from each other, the semiconductor control device 2 may be embedded in a processor of the host 3 (for example, a Central Processing Unit (CPU), an Application Processor (AP), a Graphics Processing Unit (GPU), etc.), or may be configured in the form of a System on Chip (SoC) and be fabricated in one chip along with the processors.

The semiconductor device 1 may receive a row address (RA), a column address (CA), data (DQ), a clock signal (CLK), etc. from the semiconductor control device 2, and may receive data on the basis of the received signals.

In accordance with an embodiment, the semiconductor device 1 may detect a failed part of the row address (RA) or the column address (CA). When the column address (CA) corresponds to the read command, the semiconductor device 1 may perform the read operation, and may activate an address error signal indicating the failed part (failure) of the row address (RA) or the column address (CA). In accordance with an embodiment, when the failed part (failure) of the row address (RA) is detected and the column address (CA) corresponds to the write command, the semiconductor device 1 may perform the write operation and may activate the address error signal. In accordance with an embodiment, when the failed part is detected only in the column address (CA) other than the row address (RA), and the column address (CA) corresponds to the write command, the semiconductor device 1 may perform the write operation and may activate the address error signal.

The semiconductor control device 2 may retransmit the row address (RA) and the column address (CA) upon receiving the address error signal from the semiconductor device 1.

Figure 2:
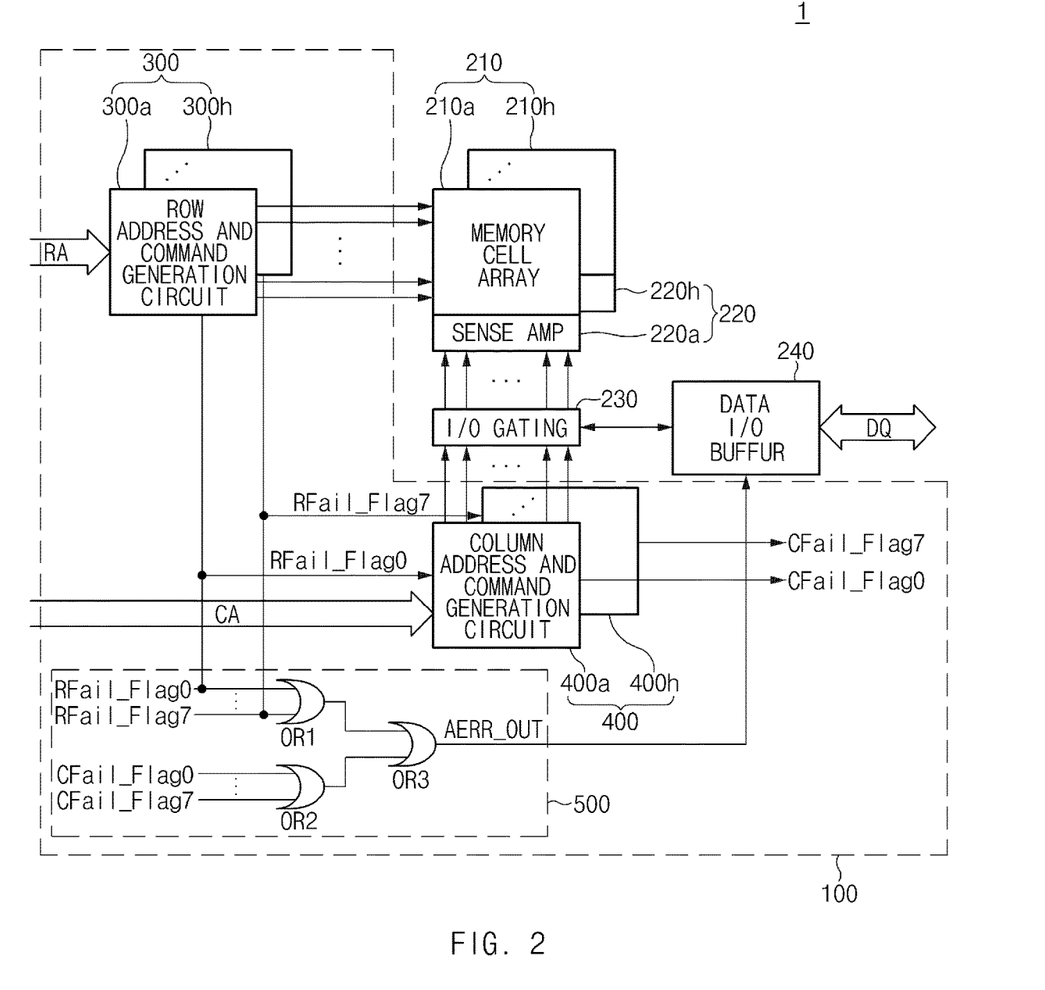
FIG. 2 is a circuit diagram illustrating a representation of an example of a semiconductor device shown in FIG. 1.

FIG. 2 is a circuit diagram illustrating the semiconductor device 1 shown in FIG. 1.

Referring to FIG. 2, the semiconductor device 1 may include an address and command generation circuit 100, a memory cell array 210, a sense amplifier (sense-amp) 220, an input and output (I and O) gating circuit 230, and a data input and output (I and O) buffer 240. The address and command generation circuit 100 may include a row address and command generation circuit 300, a column address and command generation circuit 400, and an address error output circuit 500.

The memory cell array 210 may include first to eighth banks (210a~210h). The row address and command generation circuit 300 may include first to eighth row address and command generation circuits (300a~300h) respectively coupled to the first to eighth banks (210a~210h). The column address and command generation circuit 400 may include first to eighth column address and command generation circuits (400a~400h) respectively coupled to the first to eighth banks (210a~210h). The sense amplifier 220 may include first to eighth sense amplifiers (220a~220h) respectively coupled to the first to eighth banks (210a~210h). Each of the first to eighth banks 210a~210h may include a plurality of word lines, a plurality of bit lines, and a plurality of memory cells formed at intersection points of the word lines and the bit lines. Although FIG. 2 has disclosed an example of the semiconductor device 1 including 8 banks for convenience of description and better understanding of the present disclosure, the number of banks included in the semiconductor device 1 may be changed to another, such that the number of row address and command generation circuits 300, the number of column address and command generation circuits 400, and the number of sense amplifiers 220 may also be changed as necessary.

The row address and command generation circuits (300a~300h) may decode the row address (RA), and may thus activate the word line corresponding to the row address (RA). For example, the row address and command generation circuits (300a~300h) may transmit a word-line drive voltage to the word line corresponding to the row address (RA) so as to activate the word line, and may transmit a precharge voltage to the word line so as to deactivate the word line. In accordance with an embodiment, the row address and command generation circuits (300a~300h) may detect the failed part of the row address (RA), and may thus generate row fail flag signals (RFail_Flag0~RFail_Flag7).

The column address and command generation circuits (400a~400h) may decode the column address (CA), and may thus select a bit line corresponding to the column address (CA) through the input and output (I and O) gating circuit 230 and the sense amplifiers (220a~220h). When the column address (CA) corresponds to a read command, the column address and command generation circuits (400a~400h) may perform the read operation for a memory cell corresponding to the column address (CA) irrespective of the failed part of the column address (CA). When the column address (CA) corresponds to a write command, the column address and command generation circuits (400a~400h) may correct the column address (CA). When the row address (RA) does not correspond to the failed part, the column address and command generation circuits (400a~400h) may perform the write operation for a memory cell corresponding to the corrected column address (CA). The column address and command generation circuits (400a~400h) may detect the failed part of the column address (CA), and may thus generate column fail flag signals (CFail_Flag0~CFail_Flag7).

The address error output circuit 500 may activate an address error signal (AERR_OUT) when at least one of the row fail flag signals (RFail_Flag0~RFail_Flag7) and the column fail flag signals (CFail_Flag0~CFail_Flag7) is activated.

The address error output circuit 500 may include an OR operator (OR1), an OR operator (OR2), and an OR operator (OR3). The OR operator (OR1) may perform a logic OR operation of the row fail flag signals (RFail_Flag0~RFail_Flag7). The OR operator (OR2) may perform a logic OR operation of the column fail flag signals (CFail_Flag0~CFail_Flag7). The OR operator (OR3) may perform a logic OR operation of the output signals of the OR operators OR1 and OR2. The address error signal (AREE_OUT) may be transmitted to the semiconductor control device 2 through the data input and output (I and O) buffer 240, such that the semiconductor control device 2 may retransmit the row address (RA) and the column address (CA).

The input and output (I and O) gating circuit 230 may include circuits to perform gating of input and output (I and O) data, read data latches to store output data of the first to eighth banks (210a~210h), and write drivers to write data in the first to eighth banks (210a~210h).

Data read from one of the first to eighth banks (210a~210h) may be detected by a sense amplifier corresponding to the one bank array, and may be stored in the read data latches. Data (DQ) stored in the read data latches may be applied to the semiconductor control device 2 of FIG. 2 through the data input and output (I and O) buffer 240. Data (DQ) to be written in one of the first to eighth banks (210a~210h) may be transmitted from the semiconductor control device 2 to the data input and output (I and O) buffer 240. The data (DQ) applied to the data input and output (I and O) buffer 240 may be written in the one bank array through the write drivers.

Figure 3:
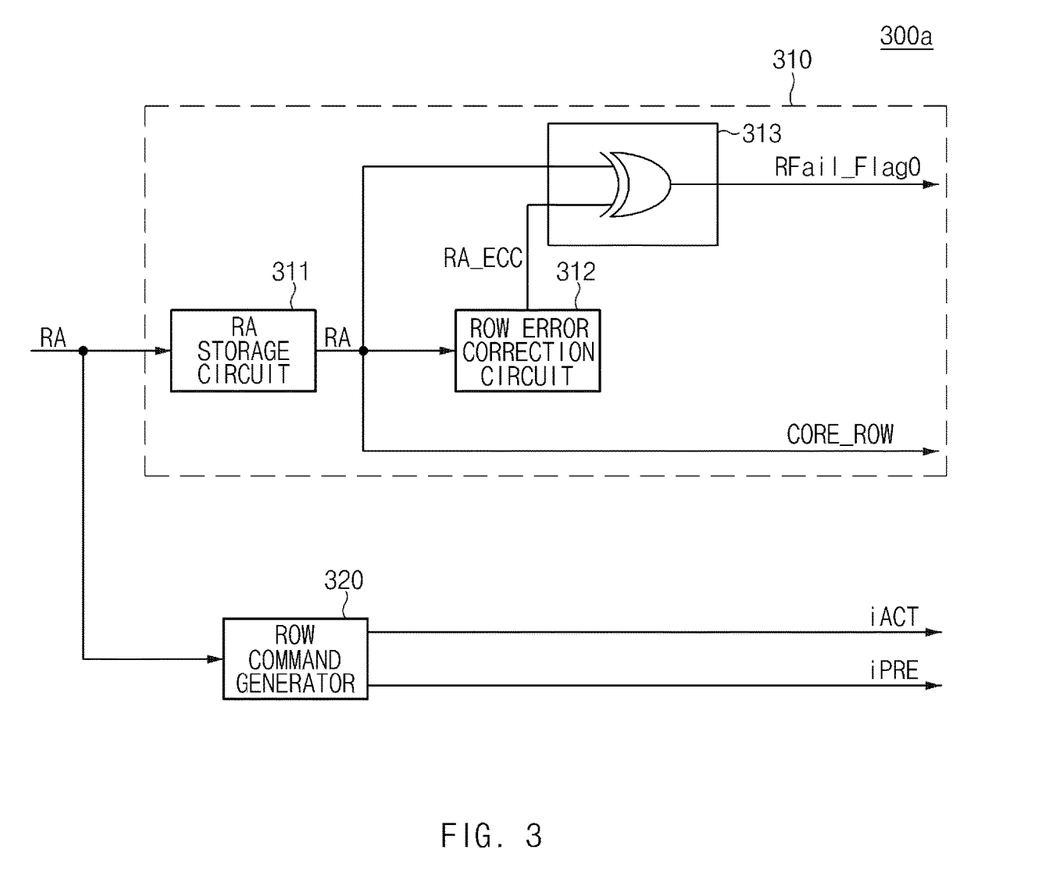
FIG. 3 is a circuit diagram illustrating a representation of an example of a row address and command generation circuit shown in FIG. 2.

FIG. 3 is a circuit diagram illustrating the row address and command generation circuit 300a shown in FIG. 2. Although FIG. 3 has disclosed only the row address and command generation circuit 300a for convenience of description and better understanding of the present disclosure, each of the row address and command generation circuits 300b~300h may also be substantially identical in structure to the row address and command generation circuit 300a.

Referring to FIG. 3, the row address and command generation circuit 300a may include a row address generator 310 and a row command generator 320.

The row address generator 310 may generate an internal row address (CORE_ROW) and a row fail flag signal (RFail_Flag0) on the basis of the row address (RA). The row command generator 320 may generate row commands iACT and iPRE on the basis of the row address (RA). The row command generator 320 may be a decoder. The row commands iACT and iPRE may be input to a drive circuit (not shown) for driving one or more word lines, such that the row commands iACT and iPRE may activate or precharge the word line corresponding to the internal row address (CORE_ROW).

The row address generator 310 may include a row address storage circuit 311, a row error correction circuit 312, and a row fail detection circuit 313.

The row address storage circuit 311 may store the row address (RA) therein. The row address storage circuit 311 may be a buffer.

The row error correction circuit 312 may correct one or more errors of the row address (RA), and may thus generate a corrected row address (RA_ECC). The row address (RA) may include an Error Correction Code (ECC) bit for correcting one or more errors. The row error correction circuit 312 may correct the error of the row address (RA) using the ECC bit.

The row fail detection circuit 313 may generate a row fail flag signal (RFail_Flag0) based on the result of comparison between the row address (RA) and the corrected row address (RA_ECC). When the row address (RA) is different from the corrected row address (RA_ECC), the row fail detection circuit 313 may activate the row fail flag signal (RFail_Flag0). When the row address (RA) is identical to the corrected row address (RA_ECC), the row fail detection circuit 313 may not activate the row fail flag signal (RFail_Flag0). The row fail detection circuit 313 may include an exclusive-OR (XOR) operator (XOR).

The row command generator 320 may be a row command decoder. The row command generated from the row command generator 320 may be an active signal (iACT) or a precharge signal (iPRE).

The row address and command generation circuit 300a may generate the row fail flag signal (RFail_Flag0) by detecting the failed part (failure) of the row address (RA). In addition, the row address and command generation circuit 300a may generate an internal row address (CORE_ROW) and internal row commands iACT and iPRE based on the row address (RA) having an uncorrected error.

Figure 4:
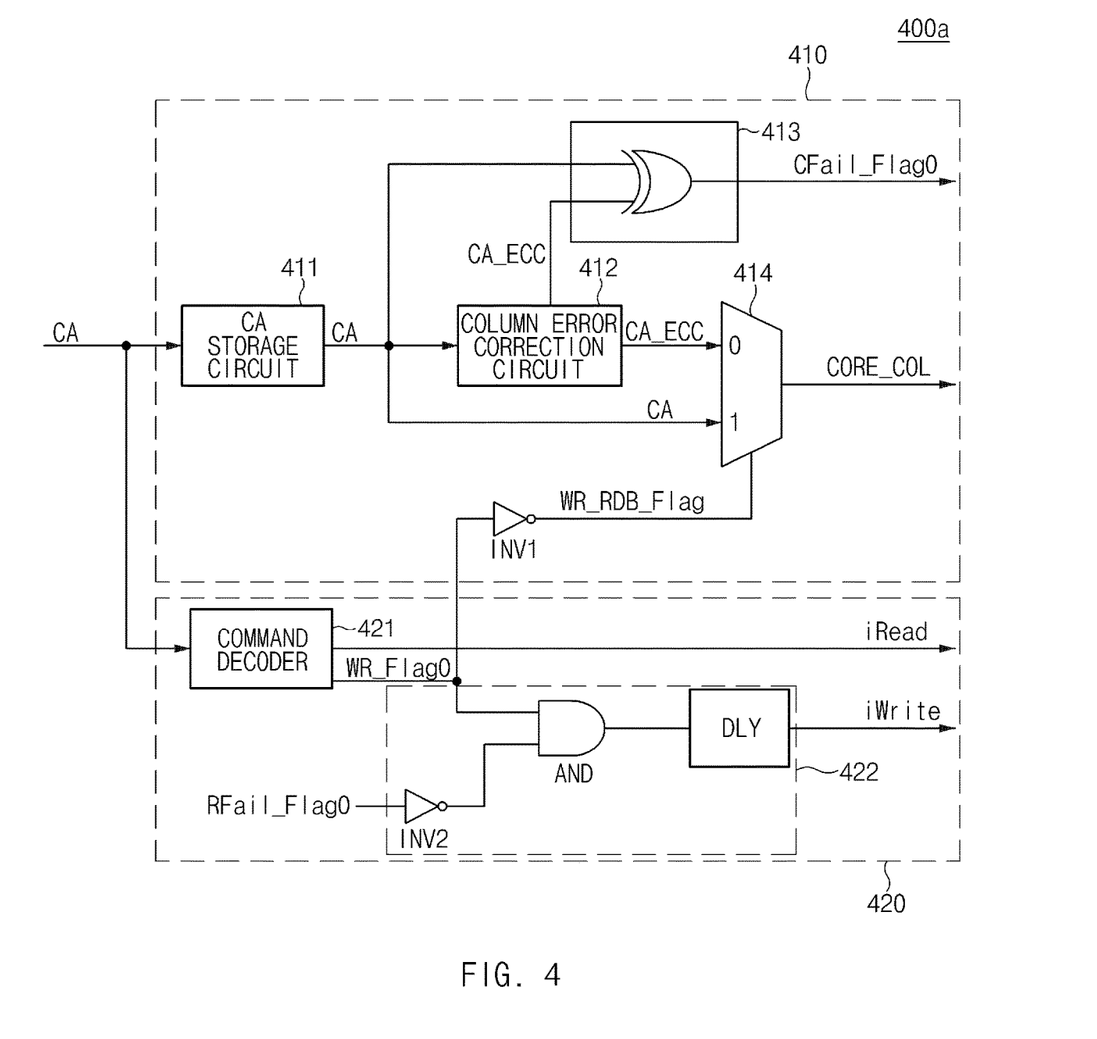
FIG. 4 is a circuit diagram illustrating a representation of an example of a column address and command generation circuit shown in FIG. 2.

FIG. 4 is a circuit diagram illustrating the column address and command generation circuit 400a shown in FIG. 2. Although FIG. 4 has disclosed only the column address and command generation circuit 400a for convenience of description and better understanding of the present disclosure, each of the column address and command generation circuits 400b~400h may also be identical in structure to the column address and command generation circuit 400a.

Referring to FIG. 4, the column address and command generation circuit 400a may include a column address generator 410 and a column command generator 420.

The column address generator 410 may generate an internal column address (CORE_COL) based on a column address (CA) and a write flag signal (WR_Flag). In accordance with an embodiment, the column address generator 410 may generate a column fail flag signal (CFail_Flag0) based on the column address (CA). The column command generator 420 may generate the column commands iRead and iWrite based on the column address (CA) and the row flag signal (RFail_Flag0). The column commands iRead and iWrite may be input to a drive circuit (not shown) for driving one or more bit lines, such that the column commands iRead and iWrite may select the bit line corresponding to the internal column address (CORE_COL). The column address generator 410 may include a column address storage circuit 411, a column error correction circuit 412, a column fail detection circuit 413, and a selection circuit 414.

The column address storage circuit 411 may store the column address (CA) therein. The column address storage circuit 411 may be a buffer.

The column error correction circuit 412 may correct one or more errors of the column address (CA), and may thus generate a corrected column address (CA_ECC). The column address (CA) may include an Error Correction Code (ECC) bit for correcting one or more errors. The column error correction circuit 412 may correct the error of the column address (CA) using the ECC bit.

The column fail detection circuit 413 may generate a column fail flag signal (CFail_Flag0) based on the result of comparison between the column address (CA) and the corrected column address (CA_ECC). When the column address (CA) is different from the corrected column address (CA_ECC), the column fail detection circuit 413 may activate the column fail flag signal (CFail_Flag0). When the column address (CA) is identical to the corrected column address (CA_ECC), the column fail detection circuit 413 may not activate the column fail flag signal (CFail_Flag0). The column fail detection circuit 413 may include an exclusive-OR (XOR) operator (XOR).

The selection circuit 414 may output the corrected column address (CA_ECC) or the column address (CA) based on a write and read flag signal (WR_RDB_Flag). When the decoded result of the column address (CA) corresponds to the write command, a write flag signal (WR_Flag) may be set to '1', and the write and read flag signal (WR_RDB Flag) corresponding to the resultant value of the write flag signal (WR_Flag) inverted by an inverter (INV1) may be set to zero '0'. In contrast, when the decoded result of the column address (CA) corresponds to the read command, the write flag signal (WR_Flag) may be set to zero '0', and the write and read flag signal (WR_RDB Flag) corresponding to the resultant value of the write flag signal (WR_Flag) inverted by an inverter (INV1) may be set to '1'. When the write and read flag signal (WR_RDB Flag) corresponds to zero '0', i.e., when the decoded result of the column address (CA) corresponds to the write command, the selection circuit 414 may output the corrected column address (CA_ECC). In addition, when the write and read flag signal (WR_RDB Flag) corresponds to '1', i.e., when the decoded result of the column address (CA) corresponds to the read command, the selection circuit 414 may output the column address (CA).

The column command generator 420 may generate the internal command (i.e., the read command iRead or the write command iWrite) based on the column address (CA). The column command generator 420 may include a command decoder 421 and a write command generator 422.

The command decoder 421 may generate the read command (iRead) or the write flag signal (WR_Flag0) by decoding the column address (CA).

The write command generator 422 may generate the write command (iWrite) based on the write flag signal (WR_Flag0) and the row fail flag signal (RFail_Flag0). For example, when the write flag signal (WR_Flag0) is activated and the row fail flag signal (RFail_Flag0) is deactivated, the write command generator 422 may activate the write command (iWrite).

The write command generator 422 may include an inverter INV2 to invert the row fail flag signal (RFail_Flag), an AND operator (AND) to perform a logic AND operation of the write flag signal (WR_Flag0) and the inverted row fail flag signal, and a delay circuit (DLY) to delay an output signal of the AND operator (AND). A delay amount of the delay circuit (DLY) may be substantially identical to that of the column error correction circuit 412. Therefore, assuming that the delay amount of other circuits (for example, the column address storage circuit 411, the column decoder 421, the inverter (INV), and the AND operator (AND)) through which the column address (CA) passes is considered negligible as compared to the delay amount of the column error correction circuit 412, a time point at which the corrected column address (CA_ECC) is generated may be substantially identical to a time point at which the write command (iWrite) is generated.

If the decoded result of the column address (CA) corresponds to the read command (iRead), the column command generator 420 may output the read command (iRead). In contrast, if the decoded result of the column address (CA) corresponds to the write command (iWrite), the column command generator 420 may output the write command (iWrite) only when the row fail flag signal (RFail_Flag0) is deactivated (i.e., only when no failed part occurs in the row address RA). As a result, during the read operation, although the failed part occurs in the row address (RA) or the column address (CA), the column address and command generation circuit 400a may perform the read operation for the failed address, may inform the semiconductor control device 2 of execution of the read operation, and may thus prevent reduction of an operation speed. In contrast, during the write operation, the column address and command generation circuit 400a may not perform the write operation when the failed part occurs in the row address (RA). If the failed part does not occur in the row address (RA) during the write operation, the column address and command generation circuit 400a may perform the write operation for the corrected column address (CA), resulting in increased accuracy of data.

Figure 5:
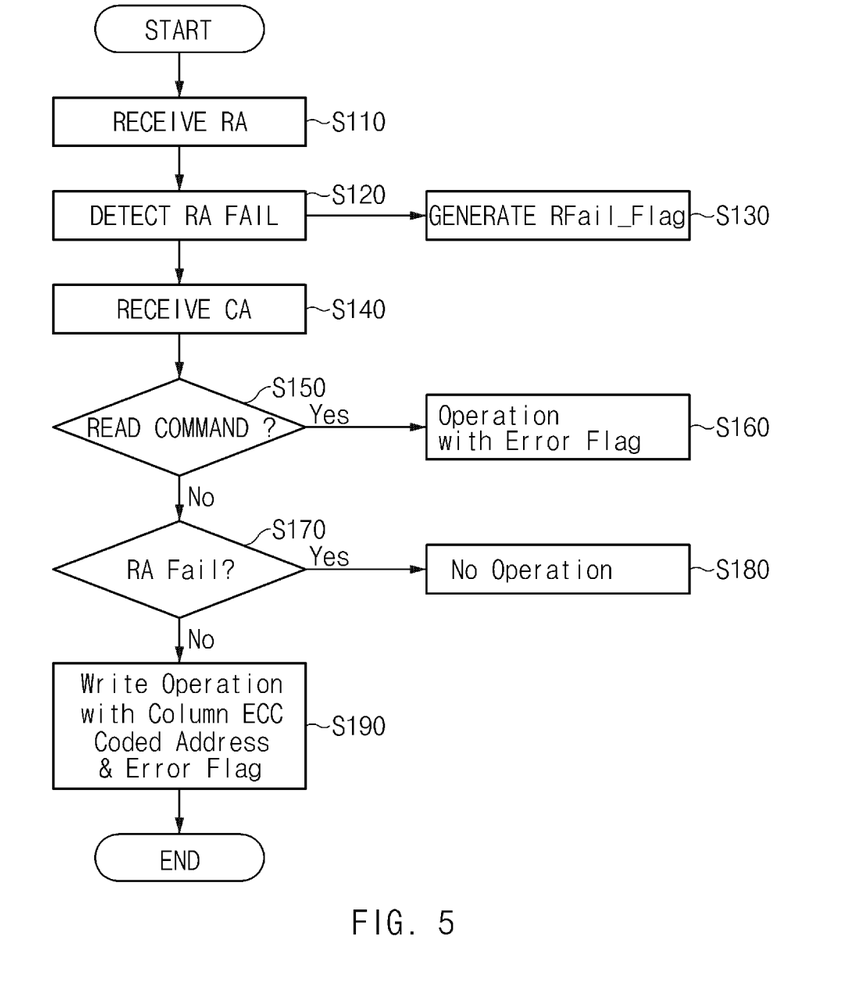
FIG. 5 is a flowchart illustrating operations of an address and command generation circuit according to an embodiment of the present disclosure.

FIG. 5 is a flowchart illustrating operations of the address and command generation circuit 100 according to an embodiment of the present disclosure.

Referring to FIG. 5, the row address (RA) may be input to the address and command generation circuit 100 (S110). The input row address (RA) may be stored in the row address storage circuit 311.

The address and command generation circuit 100 may detect the presence or absence of a failed part in the row address (RA) (S120). Although not shown in FIG. 5, the row error correction circuit 312 may generate the corrected row address (RA_ECC) based on the row address (RA). The row fail detection circuit 313 may detect the presence or absence of a failed part in the row address (RA) based on the result of comparison between the row address (RA) and the corrected row address (RA_ECC).

Then, the row fail flag signal (RFail_Flag0) may be generated according to the presence or absence of the failed part in the row address (RA) (S130). If the failed part of the row address (RA) is detected, the row fail detection circuit 313 may activate the row fail flag signal (RFail_Flag0). If the failed part of the row address (RA) is not detected, the row fail detection circuit 313 may deactivate the row fail flag signal (RFail_Flag0).

After detecting the failed part of the row address (RA) (S120), the column address (CA) may be input to the address and command generation circuit 100 (S140). The step S140 for inputting the column address (CA) to the address and command generation circuit 100 may also be carried out before expiration of the step S130 of generating the row fail flag signal (RFail_Flag0) as necessary. The input column address (CA) may be stored in the column address storage circuit 411.

After that, the address and command generation circuit 100 may determine whether the input column address (CA)

corresponds to the read command (iRead) (S150). The determination S150 may be carried out according to whether the read command (iRead) is activated based on the decoded result of the column address (CA).

If the input column address (CA) corresponds to the read command (iRead) (Yes in S150), the address and command generation circuit 100 may perform the read operation (S160). In this case, when the failed part occurs in the row address (RA) or the column address (CA), the address error signal (AERR_OUT) may be activated. In accordance with an embodiment, the address and command generation circuit 100 may perform the read operation irrespective of the presence or absence of the failed part either in the row address (RA) or in the column address (CA).

When the input column address (CA) does not correspond to the read command (iRead) (i.e., when the write flag signal (WR_Flag) is activated (No in S150), the address and command generation circuit 100 may determine the presence or absence of the failed part in the row address (RA) (S170). The write command generator 222 may determine the presence or absence of the failed part in the row address (RA) based on the row fail flag signal (RFail_Flag0) generated in the step S130 of generating the row fail flag signal (RFail_Flag0).

When the failed part occurs in the row address (RA) (i.e., when the row fail flag signal (RFail_Flag0) is activated) (Yes in S170), the address and command generation circuit 100 may not perform any operation (S180).

When the failed part does not occur in the row address (RA) (i.e., when the row fail flag signal (RFail_Flag) is deactivated) (No in S170), the address and command generation circuit 100 may perform the write operation (S190). Since the write command generator 422 generates the write command (iWrite) only when the failed part is not present in the row address (RA), the write operation may be performed when the failed part is not present in the row address (RA). In this case, if the failed part occurs in the column address (CA), the column address correction circuit 212 may correct the error of the column address (CA), and may thus generate the corrected column address (CA_ECC). Since the write and read flag signal (WR_RDB_Flag) is deactivated, the selection circuit 414 may output the corrected column address (CA_ECC). The column fail detection circuit 413 may generate the column fail flag signal (CFail_Flag0) based on the result of comparison between the column address (CA) and the corrected column address (CA_ECC).

Figure 6:
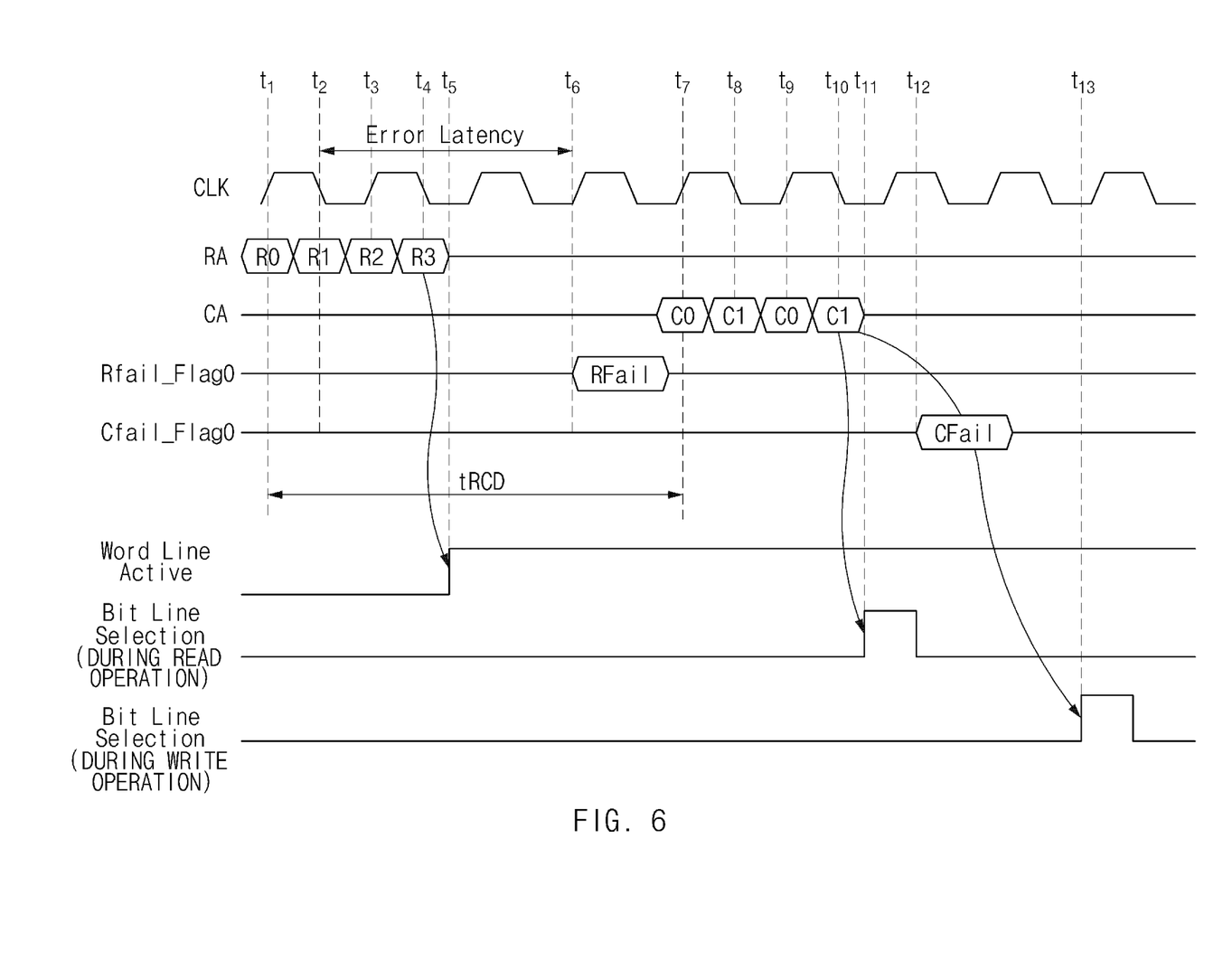
FIG. 6 is a timing diagram illustrating some signals of the address and command generation circuit according to an embodiment of the present disclosure.

FIG. 6 is a timing diagram illustrating some signals of the address and command generation circuit 100 according to an embodiment of the present disclosure. In FIG. 6, it is assumed that the row address (RA) and the column address (CA) are input, four times, to the address and command generation circuit 100 at a rising edge and a falling edge of the clock signal (CLK).

Referring to FIG. 6, the row addresses R0, R1, R2, and R3 may be input at time points t1, t2, t3, and t4, respectively. Although an embodiment of FIG. 6 assumes that the row address (RA) is input four times and is input at the rising edge and the falling edge of the clock signal (CLK) for convenience of description and better understanding of the present disclosure, the scope or spirit of the present disclosure is not limited thereto. The number of input times of the row address (RA) may be changed according to the number of address and command input terminals, the number of word lines of a memory cell, the number of banks of the memory cell, etc. If necessary, the row address (RA) may be input only at the rising edge of the clock signal (CLK), or may also be input only at the falling edge of the clock signal (CLK).

If the row addresses (R0~R3) are input at a time point (t5), word lines corresponding to the row addresses (R0~R3) may be activated. In accordance with an embodiment, irrespective of the presence or absence of the failed parts in the row addresses (R0~R3), word lines corresponding to the row addresses (R0~R3) may be activated.

The row fail flag signal (RFail_Flag0) may be generated at a time point (t6). According to the presence or absence of the failed parts in the row addresses (R9~R3), the row fail flag signal (RFail_Flag0) may be activated or deactivated. The time point (t6) may indicate a specific time at which latency (i.e., row ECC latency) of the row error correction circuit 312 has elapsed from the time point (t2).

The column addresses C0, C1, C0, and C1 may be input to time points t7, t8, t9, and t10, respectively. The above-mentioned operation of the column addresses C0, C1, C0, and C1 is only an example of the present disclosure in the same manner as in the row address (RA), and the number of input times of the column addresses or the input time points of the column addresses may be changed as necessary. The delay amount tRCD between the row address R0 is input at a time point (t1) and the column address C0 is input at a time point (t7) is illustrated in FIG. 6.

When each of the column addresses C0 and C1 corresponds to the read command and the column addresses C0 and C1 are input at a time point (t11), bit lines corresponding to the column addresses C0 and C1 may be selected. In accordance with an embodiment, when each of the column addresses corresponds to the read command, bit lines corresponding to the column addresses C0 and C1, each of which has an uncorrected error, may be selected.

The column fail flag signal (CFail_Flag0) may be generated at a time point (t12). The column fail flag signal (CFail_Flag0) may be activated or deactivated according to the presence or absence of the failed parts in the column addresses C0 and C1. The time point (t12) may indicate a specific time at which latency (i.e., column ECC latency) of the column error correction circuit 412 has elapsed from the time point (t8).

When each of the column addresses C0 and C1 corresponds to the write command (i.e., the write flag signal WR_Flag) and the row address (RA) does not have a failed part, bit lines corresponding to the column addresses C0 and C1 may be selected at a time point (t13). For example, when the write flag signal (WR_Flag) is activated and the row fail flag signal (RFail_Flag0) is deactivated, bit lines corresponding to the column addresses C0 and C1 may be selected. When the write flag signal (WR_Flag) is activated and the row fail flag signal (RFail_Flag0) is activated, bit lines corresponding to the column addresses C0 and C1 may not be selected.

As can be seen from FIG. 6, the read operation may be carried out prior to generation of the column fail flag signal (CFail_Flag0) (i.e., prior to detection of the failed parts in the column addresses C0 and C1), because the read operation is performed for the input column address (CA) instead of the column address (CA_ECC). In contrast, the write operation may be carried out after generation of the column fail flag signal (CFail_Flag0) (i.e., after detection of the failed parts in the column addresses C0 and C1), because the write operation is performed for the corrected column addresses C0 and C1.

Although not shown in FIG. 6, the read operation may be carried out even when the failed part occurs in the row address (RA). In contrast, the write operation may not be carried out when the failed part occurs in the row address (RA).

In other words, whereas an embodiment of the present disclosure may perform the read operation when the failed part occurs either in the row address (RA) or in the column address (CA), an embodiment of the present disclosure may not perform the write operation when the failed part occurs in the row address (RA).

Even when the failed part occurs in the row address (RA) or the column address (CA), an embodiment of the present disclosure may perform the read operation for the failed row address (RA) or the failed column address (CA), thereby preventing reduction of the operation speed. When the failed part occurs in the row address (RA), an embodiment of the present disclosure may not perform the write operation. When the failed part does not occur in the row address (RA) and occurs in the column address (CA), an embodiment of the present disclosure may perform the write operation for the corrected column address, such that accurate data can be stored.

The above-mentioned description has disclosed detailed explanation of the embodiments. For reference, the embodiments may include additional structures for better understanding of the invention as necessary although the additional structures are not directly associated with technical ideas of the disclosure. In addition, the Active High or Active Low constructions for indicating deactivation states of a signal and circuit may be changed according to the embodiment. The above-mentioned circuit modification may be very frequently generated, such that a very high number of cases may exist and associated modification can be easily appreciated by those skilled in the art, and as such a detailed description thereof will herein be omitted for convenience of description.

As is apparent from the above description, the embodiments of the present disclosure may correct at least one error of an address and or a command by discriminating between a read command and a write command. Therefore, the embodiments of the present disclosure may implement a rapid response to the read command, and may guarantee accuracy of data associated with the write command.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and or arrangements which are within the scope of the disclosure, the drawings and the accompanying claims. In addition to variations and modifications in the component parts and or arrangements, alternative uses will also be apparent to those skilled in the art.

What is claimed is:

1. A semiconductor system comprising:
   a semiconductor control device configured to transmit an address; and
   a semiconductor device configured to, when a failed part of the address is detected and the address corresponds to a read command, perform a read operation for the address, and activate an address error signal indicating the failed part of the address,
   wherein the address includes a row address and a column address; and
   wherein the semiconductor device is configured to, when a failed part of the row address is not detected, a failed part of the column address is detected, and the column address corresponds to a write command, perform a write operation for the row address and a corrected column address, and activate the address error signal.

2. The semiconductor system according to claim 1, wherein, when the failed part of the address is detected and the address corresponds to a write command, the semiconductor device is configured to deactivate the write command and activate the address error signal.

3. The semiconductor system according to claim 1, wherein the semiconductor control device is configured to retransmit the address based on the address error signal.

4. A semiconductor system comprising:
   a semiconductor control device configured to transmit an address; and
   a semiconductor device configured to, when a failed part of the address is detected and the address corresponds to a read command, perform a read operation for the address, and activate an address error signal indicating the failed part of the address,
   wherein the semiconductor device is configured to, when a failed part of the row address is not detected, a failed part of the column address is detected, and the column address corresponds to a write command, perform a write operation for the row address and a corrected column address, and activate the address error signal,
   wherein the address includes a row address and a column address; and
   wherein the semiconductor device includes:
      a plurality of memory banks;
      a plurality of address and command generation circuits configured to respectively correspond the plurality of memory banks, and generate a row fail flag signal and a column fail flag signal based on the row address and the column address; and
      an address error output circuit configured to activate the address error signal when at least one of the row fail flag signal and the column fail flag signal generated from the plurality of address and command generation circuits is activated.

5. The semiconductor system according to claim 4, wherein the plurality of address and command generation circuits include:
   an row address generator configured to generate the row address as an internal row address, correct an error of the row address, and generate the row fail flag signal based on the row address and the corrected row address;
   a row command generator configured to generate an active signal or a precharge signal based on the row address;

an column address generator configured to correct an error of the column address, generate the column fail flag signal based on the column address and the corrected column address, and selectively output the column address or the corrected column address as an internal column address based on a write flag signal; and a column command generator configured to generate the read command, a write flag signal, or a write command based on the column address and the row fail flag signal.

6. The semiconductor system according to claim 5, wherein the column address generator includes:

a column address storage circuit configured to store the column address;

a column error correction circuit configured to correct the error of the column address; and a selection circuit configured to select an output signal of the column address storage circuit as the internal column address when the write flag signal is deactivated, and select an output signal of the column error correction circuit as the internal column address when the write flag signal is activated.

7. The semiconductor system according to claim 5, wherein the column command generator includes:

a column decoder configured to generate the read command or the write flag signal by decoding the column address; and a write command generator configured to generate the write command based on the write flag signal and the row fail flag signal.

\* \* \* \* \*